United States Patent [19]
Athan

[11] Patent Number: 6,144,214
[45] Date of Patent: Nov. 7, 2000

[54] METHOD AND APPARATUS FOR USE IN IDDQ INTEGRATED CIRCUIT TESTING

[75] Inventor: Stephan P. Athan, Tampa, Fla.

[73] Assignee: University of South Florida, Tampa, Fla.

[21] Appl. No.: 09/068,249

[22] PCT Filed: Nov. 15, 1996

[86] PCT No.: PCT/US96/18426

§ 371 Date: Oct. 13, 1998

§ 102(e) Date: Oct. 13, 1998

[87] PCT Pub. No.: WO97/18481

PCT Pub. Date: May 22, 1997

Related U.S. Application Data

[60] Provisional application No. 60/006,783, Nov. 15, 1995.

[51] Int. Cl.[7] .................................................. G01R 31/28
[52] U.S. Cl. ............................................ 324/763; 324/765
[58] Field of Search ..................................... 324/765, 769, 324/158.1, 73.1; 714/733, 730; 257/40, 48; 438/14, 17, 18

[56] References Cited

U.S. PATENT DOCUMENTS

| | | | |
|---|---|---|---|
| 4,637,020 | 1/1987 | Schinabeck | 714/736 |
| 5,025,344 | 6/1991 | Maly et al. | 714/733 |
| 5,057,774 | 10/1991 | Verhelst et al. | 714/733 |
| 5,392,293 | 2/1995 | Hsue | 324/158.1 |

*Primary Examiner*—Vinh P. Nguyen
*Attorney, Agent, or Firm*—Stein, Schifino & Van Der Wall

[57] ABSTRACT

A built in current sensor circuit (BICS) for use in integrated circuit testing utilizing the Quiescent Power Supply testing technique comprised of a detecting transistor, an s-ram cell and a buffer cell electrically coupled in a cascaded configuration to perform a comparator function, a reference source comprised of a current generating transistor and a voltage level setting transistor, and an active output load comprised of a single p-MOSFET sized to draw a unique amount of current when a respective circuit under test is determined to be defective., whereby the additional current drawn by the active output load is readily observable on the bias line by an external standard off-the-shelf current monitor. The built in current sensor circuit thereby alleviates the excessive use of area overhead in deep submicron integrated circuits and the need for separately propagating a defect signal to an output pin.

4 Claims, 4 Drawing Sheets

METHOD AND APPARATUS FOR USE IN IDDQ INTEGRATED CIRCUIT TESTING

CROSS-REFERENCE TO RELATED APPLICATIONS

This application claims the benefit of U.S. Provisional Application No. 60/006,783, filed on Nov. 15, 1995, the disclosure of which is hereby incorporated by reference herein.

BACKGROUND OF THE INVENTION

1. Field of the Invention

This invention relates to a current sensor circuit and, more particularly, to a Built In Current Sensor Circuit for use in quiescent power supply current, or IDDQ, testing of integrated circuits.

2. Description of the Background Art

Presently, there are several different types of testing methods for detecting defaults in integrated circuits. However, one particular method has been widely accepted and successful in the electronics industry. This one particular method comprises a complementary metal oxide semiconductor (CMOS) integrated circuit test method which is known as quiescent power supply current, or IDDQ, testing. IDDQ testing achieves high fault coverage and is used to detect physical defects in integrated circuits which are not detectable using logic or functional test methods. Although IDDQ testing has been used effectively on CMOS integrated circuits (ICs) with submicron feature sizes (integrated circuits utilizing dimensions less than 1 $\mu$m), its effectiveness on ICs scaled to the deep submicron regime (typically $L_{effective}$ <0.5 $\mu$m) has not been studied extensively.

As CMOS devices are scaled to the deep submicron regime, IC reliability can be reduced due to second order effects such as hot carriers and impact ionization. Although IDDQ testing is a potential test method for detecting leakage current in scaled ICs, the area overhead, the circuit performance, and the fault detectability penalties are particularly important in scaled ICs. These listed areas are the metrics which are used to evaluate the effectiveness of IDDQ testing along with fault diagnosability.

Testing very large scale integration (VLSI) and ultra large scale integration (ULSI) integrated circuits (ICs) is becoming increasingly more difficult, more time consuming, and more costly. This is due to increased circuit complexity and circuit densities, and reduced circuit feature sizes. Future VLSI/ULSI ICs will be tested using either existing, refined, or newly developed and more cost effective test methods and equipment. In addition, a greater emphasis must be placed on implementing design-for-test (DFT) strategies early in the design cycle due to the heavy burden and costs associated with back-of-the-line testing.

There are presently four types of tests performed on CMOS ICs for detecting and locating defects and faults. They are functional, logic, parametric, and IDDQ tests. The tests are performed in combinations at wafer-, bare-, die-, packaged-, assembly-, and system-levels. Functional IC tests are designed to verify whether the IC performs its intended function. Logic tests verify the logic operation of gates and registers, while AC and DC parametric tests are used to measure time-, voltage-, and current-varying parameters associated with the operational limits of the IC. Test parameters include propagation delay, operating current, and rise and fall time. Although IDDQ is actually a parametric test, it is considered unique due to its sensitivity to a specific class of physical defects to which CMOS ICs are susceptible.

IDDQ testing is performed by applying a predetermined set of test patterns to the primary inputs of a CMOS IC. The patterns, or vectors, are designed to force adjacent uncoupled nodes to opposite logic states. This creates a current leakage path from VDD to GND if the adjacent nodes become coupled through a short or bridge. A fault is detected by measuring the increased quiescent steady state current level at the VDD or VSS pins. The technique is effective since a broad class of physical defects is known to manifest itself as increased quiescent current levels easily observable using a sensitive current monitor. The technique also provides a high level of observability since it is unnecessary to propagate internal faults to output pins of the IC for observation. In addition, the number of test patterns required to provide high fault coverage in IDDQ testing is significantly fewer than those required for full functional and logic testing.

Although IDDQ testing is used successfully on CMOS ICs with feature sizes of 1 $\mu$m and greater, very little effort has been invested in applying IDDQ test monitoring to deep submicron (below 0.5 $\mu$m) CMOS ICs. This is significant since physical defects and parametric variations such as hot electrons, gate induced drain leakage (GIDL), and excessive subthreshold leakage result in increased quiescent current. This poses a reliability concern since CMOS ICs with minimum feature sizes down to 0.1 $\mu$m are expected commercially in the near future. Thus, it is important to effectively develop and apply IDDQ measurements as a test and diagnostic tool for deep submicron CMOS ICs.

Deep submicron CMOS technology is becoming the dominant technology for ULSI integrated circuits to be used in future applications. It promises faster circuit operation, lower power consumption, and more processing capability per chip than present CMOS technology. The development of deep submicron CMOS ICs requires a very close relationship between design, process, and test engineering. In addition, an in-depth understanding of MOS device physics and modeling for deep submicron process technology is imperative. This is especially true since some types of defects are difficult to detect using conventional commercial tools. These are low current defects which can cause catastrophic system failure if undetected. Thus, reliability concerns increase dramatically as circuit and feature sizes are scaled to the deep submicron regime.

Some reliability concerns in deep submicron ICs are caused by short channel effects which are far more damaging in scaled devices than in near-micron devices. A primary reliability concern in scaled devices is hot electrons. These are electrons in the channel region which are accelerated towards the gate oxide under the high field strength, penetrate the gate oxide, and ultimately become trapped therein. These trapped charges have the negative effect of raising the threshold voltage and reducing the drain current and device transconductance. Despite the success of applying conventional scaling rules to devices scaled from 2 $\mu$m to 1 $\mu$m, the same rules do not apply when devices are further scaled down to deep submicron features.

Thus, IDDQ testing has become a proven and cost effective CMOS IC screening tool. Although IDDQ testing is used successfully with near-micron CMOS processes, its feasibility in deep submicron ($L_{effective}$ <0.5 $\mu$m) CMOS processes has not been fully developed. In expanding the utilization of IDDQ testing into the deep submicron regime, many problems exist with the current techniques and circuit designs presently being used in the industry.

IDDQ testing imposes several penalties on present day CMOS ICs including circuit under test (CUT) performance degradation, increased IC area overhead, and low test speed versus current resolution sensing ratio. Notwithstanding, the advantages of IDDQ testing have been shown to overshadow the penalties in near micron processes.

However, as IC feature sizes are scaled down to deep submicron levels, the penalties associated with IDDQ testing increase significantly. This is due to higher operating speeds, greater gate density, and lower operating voltages than in near micron ICs. In addition, the class of current leakage faults in deep submicron process technology is extended to further include certain second order and short channel effects such as hot carriers and impact ionization. These additional faults are due to strong device interdependencies and specification tolerances resulting from scaled features. Thus, the problems associated with the IDDQ testing techniques and circuit designs currently being used in the industry in contemporary CMOS technologies severely limit the use of IDDQ testing in deep submicron applications.

There are several approaches to the application of IDDQ testing of ICs. One approach is to monitor the steady state current externally with an off-the-shelf high resolution current monitor. Another approach is to monitor the steady state current internally by way of designing a current monitor into the fundamental circuit or by placing the current monitor circuit on a separate chip adjacent the circuit under test as is performed in multichip module designs.

The external testing approach presents several problems which renders its use in deep submicron applications impractical. External monitoring of the IDDQ current requires special testing hardware and significantly longer test times per cycle due to waiting for the circuit under test to settle into its steady state before taking the measurement. Thus, for deep submicron applications, it is the internally located current monitor approach that presents the most efficient means for overcoming the current problems associated with deep submicron IDDQ testing. The class of internal IDDQ monitors are built as dedicated embedded built in current sensor (BICS) circuits designed around a set of IC-specific specifications. Implementing efficient and cost effective BICS circuits requires a sound and well organized approach. The BICS should handle two extreme situations. During functional testing, the circuit under test draws a large transient current. The BICS must be capable of handling this large current without introducing a significant voltage drop across the sensing element. Once the current settles into a steady-state, the BICS circuit must be capable of detecting the small leakage currents caused by a fault. To meet these two requirements, the BICS circuit should have a small resistance whenever a large transient current occurs and a large equivalent input resistance when detecting faulty leakage current. It is therefore impractical to employ a linear element such as a resistor to both sink and detect the current since both conditions cannot be met simultaneously.

Generally, these internal current monitors are fundamentally custom analog BICS circuits designed with standard passive and active components such as capacitors, resistors, and operational amplifiers. In short, advantages of internal current monitors include their ability to operate at higher test, operate under wider current ranges, exhibit small footprints, and operate under very low power consumption. These are important design attributes since the current monitors may reside on the same piece of silicon, or substrate, as the circuit under test. In the case of a partitioned circuit requiring multiple current sensors, specific design tradeoffs can be made to optimize the circuit area and the number of gates per monitor.

Representative examples of internal built in current sensor circuits are disclosed in U.S. Pat. No. 5,025,344, issued to Maly and Nigh, U.S. Pat. No. 5,371,457, issued to Lipp, and U.S. Pat. No. 5,392,293, issued to Hsue, the disclosures of which are hereby incorporated by reference herein. Further, other representative examples of internal built in current sensor circuits are disclosed in the technical journal articles of: Brown, B. D., and McLeod, R. D., "*Built-in Current Mode Circuits for Iddq Monitoring*", *Cust. Integ. Ckts. Conf.* pp 30.6.1–6.4, 1993; Hao, H., and McCluskey, E. J., "*Anaylsis of Gate Oxide Shorts in CMOS Circuits*", *IEEE Tran. on Computers*, vol 42, no. 12, pp. 1510–1516, December 1993; Hsue, C., and Lin, C., "*Built-In Current Sensor for Iddq Test in CMOS*", *IEEE Intl.Test Conf*, pp. 635–641, 1993; Maly, W., and Patyra, M., "*Design of ICs Applying Built-In Current Testing*", *Jnl. of Elec. Test, Thry. & Applic.*, pp. 111–120 December 1992; Mao, W., and Gulati, R. K., "*QUIETEST: A Methodology for Selecting Iddq Test Vectors*", *Jnl. Elec. Test Thry. and Applic.*, pp. 63–71, December 1992; Menon, S. M., et. al., "*The Effect of Built-In Current Sensors (BICS) on Operational and Test Performance*", *IEEE Conference on VLSI Design*, pp. 187–190, January 1994; Miura, Y., and Kinoshita, K., "*Circuit Design for Built-in Current Testing*", *Proc. IEEE Intl. Test Conf*, pp. 873 881, 1992; Nigh, P., and Maly, W., "*Test Generation for Current Testing*", *IEEE Design & Test of Computers*, pp 26–38, February 1990; Rius, J., and Figueras, J., "*Proportional BIC Sensor for Current Testing*", *Jnl. Elec. Test Thry. & Applic.*, pp. 101–110, December 1992; Shen, T. L., Daly, J. C., and Lo, J. C., "*A2-ns Detecting Time, 2-μm CMOS Built-In Current Sensing Circuit*", *IEEE Jnl. Sld. St. Ckts.*, Vol. 28, No. 1, pp. 72–77, January 1993; and Tang, J., Lee, K., and Liu, B., "*A Practical Current Sensing Technique for IDDQ Testing*", *IEEE Trans. on VLSI Systems*, Vol. 3, No. 2, pp. 302–310, June 1995, the disclosures of which are hereby incorporated by reference herein.

While all of the above referenced examples of internal built in current sensor circuits have been used in near-micron ICs, none of them are suitable for use in deep submicron applications due to their lack of current sensitivity, excessive area overhead, required additional amplifiers and summing circuits, excessive circuit complexity and larger operating power requirements. Additionally, besides having the above listed inadequacies, the built in current sensor circuit disclosed by Shen further includes a diode in the detecting portion of the sensor circuit which can prevent reliable circuit operation in ICs operating at 1 to 2 volts due to the minimum 0.65 volts across the diode. This minimum voltage limits the sensitivity and ultimate current range of the detecting portion of the circuit. ICs having feature sizes in the deep submicron region generally operate at low supply voltage levels.

Therefore, it is an object of this invention to provide an improvement which overcomes the aforementioned inadequacies of the prior art devices and provides an improvement which is a significant contribution to the advancement of IDDQ fault testing art.

Another object of this invention is to provide a built in current sensor circuit and method for use in testing integrated circuits for defects that is less complex and inexpensive to manufacture.

Another object of this invention is to provide a built in current sensor circuit and method for use in testing integrated circuits for defects that has high reliability.

Another object of this invention is to provide a built in current sensor circuit and method for use in testing integrated circuits for defects that provides for highly accurate IDDQ testing.

Another object of this invention is to provide a built in current sensor circuit and method for use in testing integrated circuits for defects that has a small footprint and reduces the area overhead required in the IC thereby facilitating the configuring of smaller partition sizes resulting in larger numbers of partitions and higher test resolution for improved defect diagnosis.

Another object of this invention is to provide a built in current sensor circuit and method for use in testing integrated circuits for defects that provides for fast IDDQ test speeds suitable for large scale deep submicron integrated circuit testing whereby simultaneous testing of multiple partitions is possible using standard test patterns. Ultimately, real time IDDQ fault detection and diagnosis is provided for.

Another object of this invention is to provide a built in current sensor circuit and method for use in testing integrated circuits for defects that requires less test patterns to be applied to the IC for complete IDDQ testing.

Another object of this invention is to provide a built in current sensor circuit and method for use in testing integrated circuits for defects that provides for delay fault testing.

Another object of this invention is to provide a built in current sensor circuit and method for use in testing integrated circuits for defects that provides a high measurement sensitivity for IDDQ currents and is readily used in conjunction with existing external current monitors.

Another object of this invention is to provide a built in current sensor circuit and method for use in testing integrated circuits for defects that has a wide current range capable of being sensed so to facilitate the measuring of large scale integrated circuits having a large amount of gates.

Another object of this invention is to provide a built in current sensor circuit and method for use in testing integrated circuits for defects that is capable of handling the transient currents of the circuit under test.

Another object of this invention is to provide a built in current sensor circuit and method for use in testing integrated circuits for defects that is readily adaptable to multichip module (MCM) technology.

Another object of this invention is to provide a built in current sensor circuit for use in testing integrated circuits for defects by sensing current increases caused by the defects, the built in current sensor circuit comprising in combination: detecting means for detecting current flow through the integrated circuit and providing a representative signal therefor; reference source means for providing a reference threshold signal, the reference source means being electrically coupled relative to the detecting means; comparator means for comparing the reference threshold signal to the representative signal, the comparator means being electrically coupled to the detecting means and electrically coupled to the reference source means; and an active output load electrically coupled to the comparator means, the active output load being sized to draw a disproportionately larger current when turned on than the current caused by the defect in the integrated circuit, whereby the comparator means turns on the active output load when the representative signal is determined to be larger than the reference threshold signal and the current draw of the active output load is resultantly sensed indicating that the integrated circuit is defective.

The foregoing has outlined some of the pertinent objects of the invention. These objects should be construed to be merely illustrative of some of the more prominent features and applications of the intended invention. Many other beneficial results can be obtained by applying the disclosed invention in a different manner or by modifying the invention within the scope of the disclosure. Accordingly, other objects and a more comprehensive understanding of the invention may be obtained by referring to the summary of the invention, and the detailed description of the preferred embodiment in addition to the scope of the invention defined by the claims taken in conjunction with the accompanying drawings.

SUMMARY OF THE INVENTION

The invention is defined by the appended claims with the specific embodiment shown in the attached drawings. For the purpose of summarizing the invention, the invention comprises a novel built in current sensor circuit for use in quiescent power supply current (IDDQ) testing for locating defects in integrated circuits. The built in current sensor of the present invention is suitable for use in a single integrated circuit as well as in integrated circuits having partitions. The built in current sensor circuit of the present invention is comprised of a detecting means, a reference source means, a comparator means and an active output load.

The detecting means is comprised of a detecting transistor which produces a voltage in correspondence to the current flowing from the drain to the source. The current flowing through the detecting transistor being the same current that is flowing through the integrated circuit. The detecting means is electrically coupled to the comparator means and the output of the integrated circuit. The comparator means is comprised generally of a standard s-ram cell and buffer cell. The buffer cell is electrically coupled in a cascaded to the s-ram cell. The detecting transistor is electrically coupled to the s-ram cell thereby providing a representative signal to be compared to the reference signal.

The reference source means is comprised generally of a current generating transistor and a voltage level setting transistor. The current generating transistor produces the current that flows through the voltage level setting transistor thereby causing a voltage drop across the voltage level setting transistor. This voltage level becomes the reference threshold signal that is compared to the representative signal obtained from the current flowing through the integrated circuit. The voltage level setting transistor is electrically coupled to the s-ram cell so as to provide the reference threshold signal thereto.

The s-ram cell performs a comparison of the representative signal to the reference threshold signal and subsequently enables one side of the buffer cell so to either turn on an active output load or simply turn on the other and bypass any additional load.

The active output load is comprised generally of an output transistor. The active output load can be formed from various transistor configurations but, must be configured to only draw current when a defect is determined. The active output load is turned on by one of the sides of the buffer cell of the comparator means when the additional current draw due to a defect in the integrated circuit or, when testing a partitioned integrated circuit, in the circuit under test is detected by the detecting means and a representative signal is produced that is greater in amplitude than the reference threshold signal.

In addition, it is the active output load that is specifically sized so to draw a unique amount of current that is easily observable on the bias line over and above the steady state current being drawn by the integrated circuit and built in current sensor circuit. The unique amount of current being drawn by the active output load will then specifically identify the integrated circuit as being defective. In integrated circuits that have a plurality of partitions, each built in current sensor circuit electrically coupled to each partition will have an output transistor that is sized to specifically identify that particular partition as being defective.

Alternatively, the active output load may be comprised of a pair of complementary output transistors. Again these transistors are specifically sized so to draw a unique amount of current that is easily observable on the bias line over and above the current being drawn by the integrated circuit and built in current sensor circuit. The unique current drawn by the pair of complementary output transistors will then specifically identify the integrated circuit as being defective. Similarly, as described above, in integrated circuits that have a plurality of partitions, each built in current sensor circuit electrically coupled to each partition will have a pair of complementary transistors that are sized to specifically identify that particular partition as being defective.

Thus, by simply consuming more current in specific amounts over and above the steady state current draw of the integrated circuit and built in current sensor circuit, the signaling of a defect can be easily observed on the bias line (Vdd) by using standard off-the-shelf current monitors. Additionally, the specific partition that is defective can be determined by mapping the specific amount of increase in the total bias line current draw. In conditions of multiple defects, where more than one partition turns on its respective active output load, the particular partition locations become identified by considering in combination the specific test patterns applied to the integrated circuit, the specific current draws of each of the respective active output loads and the actual current increase sensed on the bias line. In short, each active output load serves as a signature for each specific partition in the integrated circuit or for the integrated circuit itself if no partitions are present.

An important feature of the present invention is that the built in current sensor circuit and method for use in testing integrated circuits for defects has a small footprint and reduces the area overhead required in the IC thereby facilitating the configuring of smaller partition sizes resulting in larger numbers of partitions and higher test resolution for improved defect diagnosis.

Another important feature of the present invention is that the built in current sensor circuit and method for use in testing integrated circuits for defects provides for fast IDDQ test speeds suitable for large scale deep submicron integrated circuit testing whereby simultaneous testing of multiple partitions is possible using standard test patterns. Ultimately, real time IDDQ fault detection and diagnosis is provided for.

Another important feature of the present invention is that the built in current sensor circuit and method for use in testing integrated circuits for defects provides a high measurement sensitivity for IDDQ currents and is readily used in conjunction with existing standard external current monitors.

Another important feature of the present invention is that the built in current sensor circuit and method for use in testing integrated circuits for defects is readily adaptable to multichip module (MCM) technology.

Another important feature of the present invention is that the built in current sensor circuit and method for use in testing integrated circuits for defects utilizes an active output load that is specifically sized to draw a unique amount of current when turned on such that the particular integrated circuit or partition within an integrated circuit is identified as being defective by way of a standard external current monitor sensing the total current drawn on the bias line.

Another important feature of the present invention is that the built in current sensor circuit and method for use in testing integrated circuits for defects alleviates the need for additional amplifiers, summing circuits, buffers and the like to be utilized for propagating any defect indicating signal from the built in current sensor circuit to a separate output pin only to be subsequently monitored with an additional external tester channel in a high speed digital tester.

Another important feature of the present invention is that the built in current sensor circuit and method for use in testing integrated circuits for defects alleviates the need to route the individual fault lines from the partitions to the summing circuit and output error bit line which ultimately reduces the area overhead thereby significantly increases the reliability of the overall integrated circuit.

The foregoing has outlined rather broadly, the more pertinent and important features of the present invention. The detailed description of the invention that follows is offered so that the present contribution to the art can be more fully appreciated. Additional features of the invention will be described hereinafter. These form the subject of the claims of the invention. It should be appreciated by those skilled in the art that the conception and the disclosed specific embodiment may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more succinct understanding of the nature and objects of the invention, reference should be directed to the following detailed description taken in connection with the accompanying drawings in which.

Similar reference characters refer to similar parts throughout the several views of the drawings.

DETAILED DESCRIPTION OF THE PREFERRED EMBODIMENT

The present invention addresses identifying and locating physical defects that are characteristic of CMOS integrated circuits. In manufacturing integrated circuits there is an ever pending need to be able to screen out defective integrated circuits before they are assembled in electronics. In many instances, the defects are not readily ascertainable except by way of having the integrated circuit undergo various electrical tests. One such testing method is Quiescent Power Supply (IDDQ) testing wherein the steady state current of the integrated circuit is monitored while certain test signal patterns are applied to the inputs of the integrated circuit. The present invention addresses the application of such IDDQ testing on integrated circuits having feature sizes in the deep submicron (<0.5 $\mu$m) range.

Figure 1:
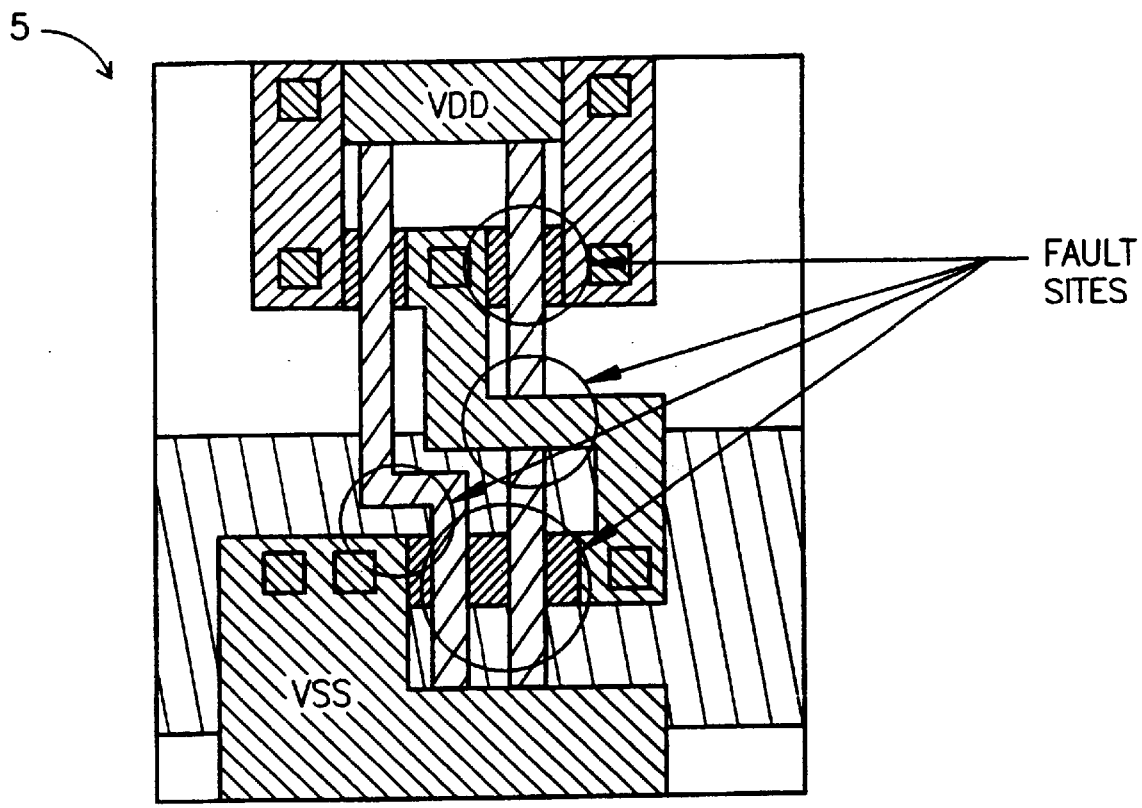
FIG. 1 is a top plan view of the layout of a typical CNOS Nand gate illustrating the common locations where defects generally occur due to bridging shorts, open circuits, hot electrons, gate induced drain leakage, excessive subthreshold leakage and certain second order and short channel effects such as hot carriers and impact ionization.
Figure 2:
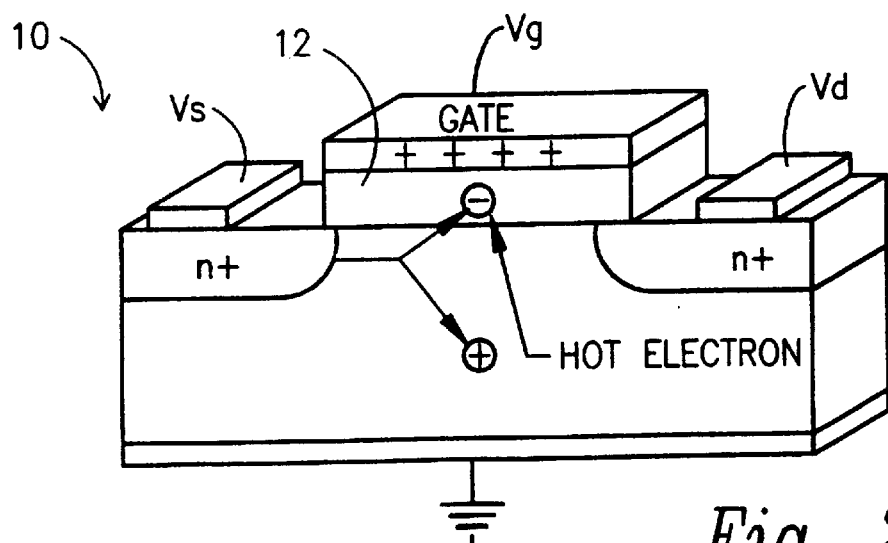
FIG. 2 is an isometric view of the structure of a typical n-MOSFET illustrating the hot carrier effect type of defect that occurs in the channel.

In referring first to FIGS. 1 and 2, a top plan view of the layout of a typical CMOS Nand gate 5 illustrating the common locations where faults generally occur and an isometric view of the structure of a typical n-MOSFET 10 illustrating the hot carrier effect type of defect that can occur in integrated circuits in the deep submicron range can be seen. In FIG. 1, the areas where defects are commonly located are circled for clarity and labeled fault sites. Such common defects are bridging shorts, open circuits, hot electrons, gate induced drain leakage, excessive subthreshold leakage and certain second order and short channel effects such as hot carriers and impact ionization. FIG. 2 illustrates the hot carrier effect defect occurring in an n-MOSFET 10 where a hot electron has gained enough energy to migrate through to the gate dielectric 12 whereby the overall electrical characteristics of the n-MOSFET 10 are resultantly changed thereby significantly degrading the electrical performance. It is these types of defects that the built in current sensor circuit of the present invention addresses in deep submicron integrated circuit applications by way of IDDQ testing with.

Figure 3:
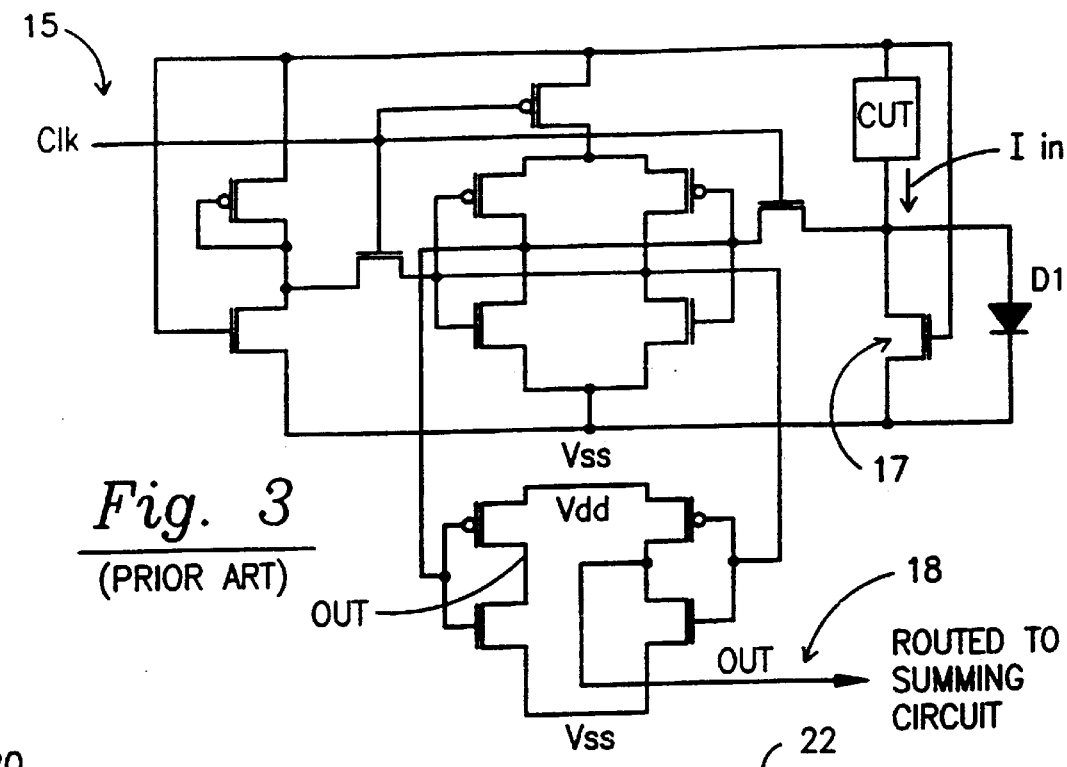
FIG. 3 is a schematic view of a built in current sensor circuit that is currently known in the industry for use in IDDQ testing of near micron integrated circuits.

In now referring to FIG. 3, a known current sensor circuit 15 can be seen that is utilized in near micron applications (>1 $\mu$m). In the current sensor circuit 15 it can readily be seen that diode D1 is connected in parallel with field effect transistor 17 so to perform the current detection of current Iin flowing through the circuit under test, generally represented by the block referenced as CUT. More importantly, it can be readily seen that the output 18 of the current sensor circuit 15 is required to be further routed to a summing circuit for additional processing (summing circuit not shown for clarity sake).

Figure 4:
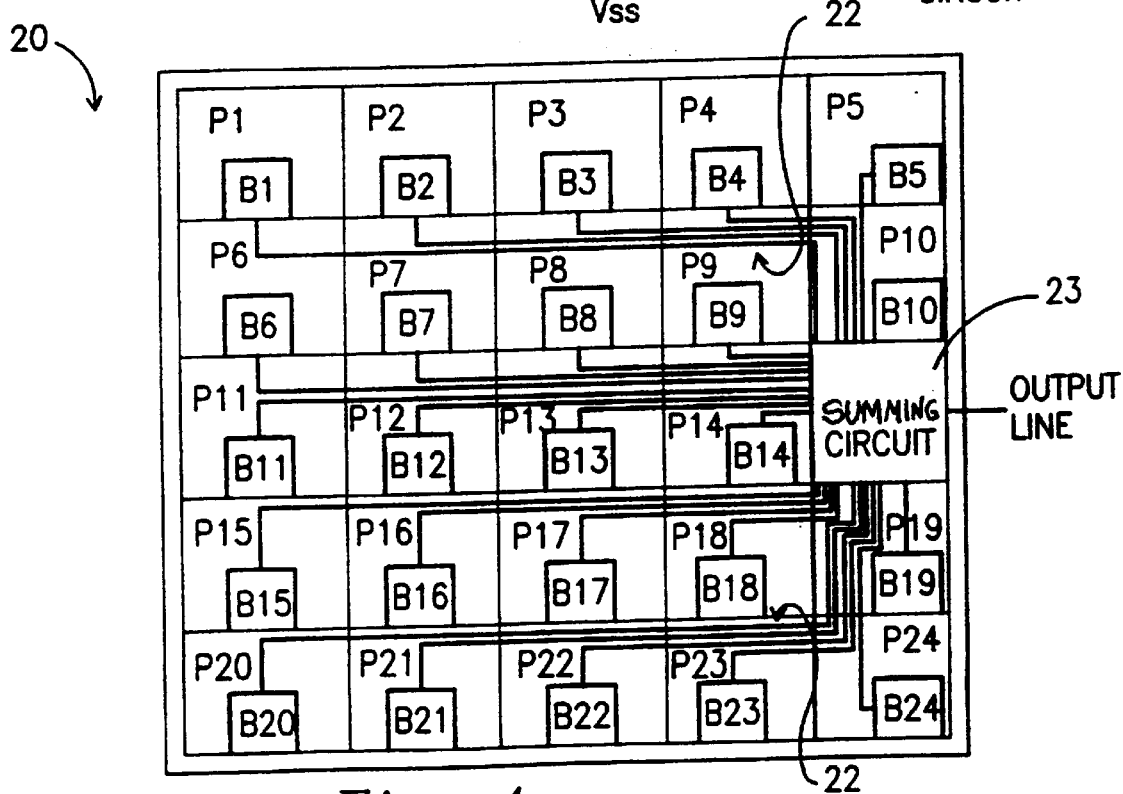
FIG. 4 is a top plan view of the layout of a partitioned integrated circuit utilizing the built in current sensor circuit shown in FIG. 3 illustrating various partitions and built in current sensor circuits located in an integrated circuit, and the excessive area overhead taken up by the additional transmissions lines and summing circuit required to propagate the defect identifying signal from the built in current sensor to the summing circuit and then to an output pin to be subsequently monitored with an additional external high speed digital tester.

The result of applying the known current sensor 15 to an integrated circuit design can be readily seen in FIG. 4 wherein a top plan view of a partitioned integrated circuit layout 20 is shown. The partitioned integrated circuit layout 20 can be seen to include partitions P1–P24 and current sensor circuits B1–B24 as would typically be configured when using the known current sensor circuit 15 as shown in FIG. 3. The excessive area overhead taken up by transmission lines 22 and the additional summing circuit 23 can also be seen in their relative locations. The additional transmission lines 22 and scanning circuit 23 take up valuable area and cause longer testing times such that use of current sensing circuits 15 is not possible in integrated circuits having deep submicron feature sizes where thousands of partitions are present.

Figure 5:
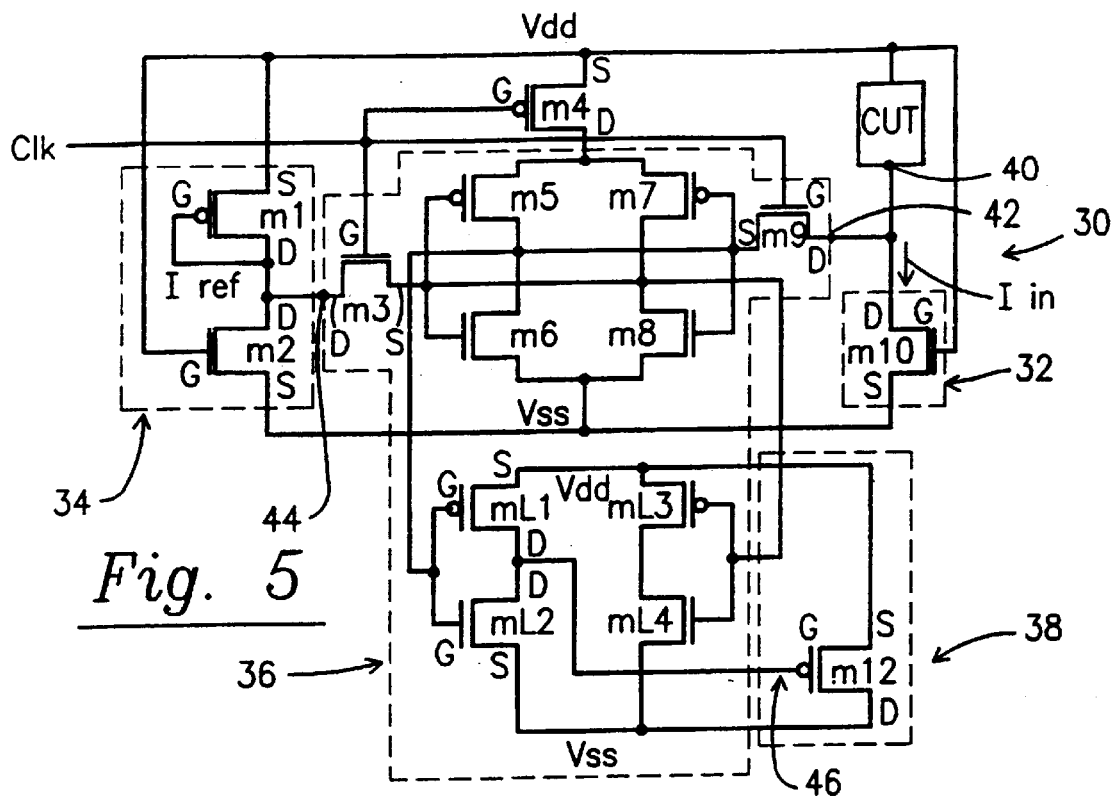
FIG. 5 is a schematic view of the built in current sensor circuit of the present invention illustrating the electrical configuration and component make up of the detecting means, comparator means, reference source means and active output load.

In overcoming the inadequacies of the known built in current sensors for applications in the deep submicron range, the present invention incorporates the built in current sensor circuit 30 as seen in FIG. 5. In referring now to FIG. 5, the built in current sensor circuit 30 can be seen to be comprised of a detecting means 32, a reference source means 34, a comparator means 36 with enabling transistors m3 and m9, an active output load 38 and an enabling transistor m4.

The detecting means 32 is electrically coupled to the output terminal 40 of the circuit under test CUT. The circuit under test CUT further includes input terminals (not shown) that receive automatic test signal patterns during testing. The detecting means 32 is generally comprised of a detecting transistor m10 having a gate G, a drain D and a source S. The gate G of the detecting transistor m10 is electrically coupled to the bias line Vdd. In particular, it is the drain D of the detecting transistor m10 that is electrically coupled to the output terminal 40 of the circuit under test CUT as well as to a first input 42 of the comparator means 36 which is the drain D of the enabling transistor m9. The source S of the detecting transistor m10 is electrically coupled to the ground line Vss.

Although various forms of transistors may be utilized to accomplish the detecting function, it is preferable that the detecting transistor m10 be in the nature of an n-MOSFET. The gate G of the detecting transistor m10 is preferably dimensioned so as to be capable of handling large transient currents from the circuit under test CUT while at the same time being capable of sensing and producing a voltage corresponding to the low level steady state current Iin that is being sensed.

The reference source means 34 is electrically coupled to a second input 44 of the comparator means 36 which is the drain D of enabling transistor m3. The reference source means 34 is generally comprised of a current generating transistor m1 and a voltage level setting transistor m2 that cooperate with each other to produce a reference threshold signal. Although various forms of transistors may be utilized to accomplish the reference source function, it is preferable that the current generating transistor m1 be in the nature of a p-MOSFET and the voltage level setting transistor m2 being in the nature of an n-MOSFET. Further, it is also imperative that the voltage level setting transistor m2 and the detecting transistor m10 be sized to have matching process parameters. This ensures a consistent correlation of current flow to resulting voltage drop across the respective m2 and m10 transistors so as to facilitate the proper setting of the reference threshold signal within the range of the representative signal produced by the detecting transistor m10.

More specifically, the source S of the current generating transistor m1 is electrically coupled to the bias line Vdd, its gate G is electrically coupled to its drain D. The drain D of the current generating transistor m1 is further electrically coupled to the drain D of the voltage level setting transistor m2. AS for the voltage level setting transistor m2, its source S is electrically coupled to the ground line Vss and its gate G is electrically coupled to the bias line Vdd. The drains D of the current generating transistor m1 and the voltage level setting transistor m2 are further electrically coupled to the second input 44 of the comparator means 36 (which is drain D of enabling transistor m3).

The comparator means 36 is generally comprised an s-ram cell and a buffer cell that are electrically coupled to each other in a standard cascaded configuration. The s-ram cell is comprised generally of transistors m5–m8 along with enabling transistors m3 and m9. The buffer cell is comprised generally of transistors mL1–mL4 that are configured as complementary pairs that function as dual logic inverters. The comparator means 36 is biased up by way of an enabling transistor m4 having its source S electrically coupled to the bias line Vdd and its drain D electrically coupled to the sources S of transistors m5 and m7. For simplicity reasons and due to the standard nature of the s-ram cell and buffer cell cascaded configuration, a detailed description of the individual gate G, drain D and source S electrical connections of the individual transistors m5–8 and mL1–mL4 will not further be discussed herein. Instead, further discussion will be directed to the electrical connections of the comparator means 36 in terms of the first and second inputs 42 and 44 and an output 46. As for the location of the output 46, it can be seen that it is tapped off of the drains D of transistors mL1 and mL2 of the buffer cell.

With the s-ram cell and buffer cell configured in a cascaded fashion as shown, the complete configuration will function as a comparator wherein the representative signal generated by the detecting means 32 is compared to the reference threshold signal and a logic output is generated on output 46. Although various forms of transistors may be utilized to accomplish the comparator function, it is preferable that transistors m5 and m7 be in the nature of p-MOSFETs and that transistors m6 and m8 be in the nature of n-MOSFETs in s-ram cell. As for the buffer cell, it is preferable that transistors mL1 and mL3 be in the nature of p-MOSFETs and that transistors mL2 and mL4 be in the nature of n-MOSFETs. In addition, although various forms of transistors may be utilized to accomplish the enabling function of transistors m3, m4 and m9, it is preferable that enabling transistors m3 and m9 be in the nature of n-MOSFETs having identically matched process parameters and that enabling transistor m4 be in the nature of a p-MOSFET. It is noted herein that the enabling transistors m3, m4 and m9 are all individually turned on by way of a clock signal CLK electrically provided to their respective gates G.

The active output load 38 is generally comprised of a single output transistor m12 having a gate G electrically coupled to the output 46 of the comparator means 36. The drain D of the output transistor m12 is electrically coupled to the ground line Vss and its source S is electrically coupled to the bias line Vdd. Although various forms of transistors may be utilized to accomplish the active output load function, it is preferable that the output transistor be in the nature of a p-MOSFET that is sized to draw a specific amount of current when biased up that is disproportionately larger than the additional current caused by the defect in the circuit under test CUT as well as the combined steady state current draw of the built in current sensor circuit 30 and circuit under test CUT. When the output transistor m12 is biased up, the additional current draw can be readily observed on the bias line Vdd by way of a standard off-the-shelf current monitor to signify that a defect is present in the circuit under test CUT. In applications where the integrated circuit is comprised of multiple partitions, the specific amplitude of current observed by the off-the-shelf current monitor on the bias line Vdd can identify which partition in particular is defective.

Figure 6:
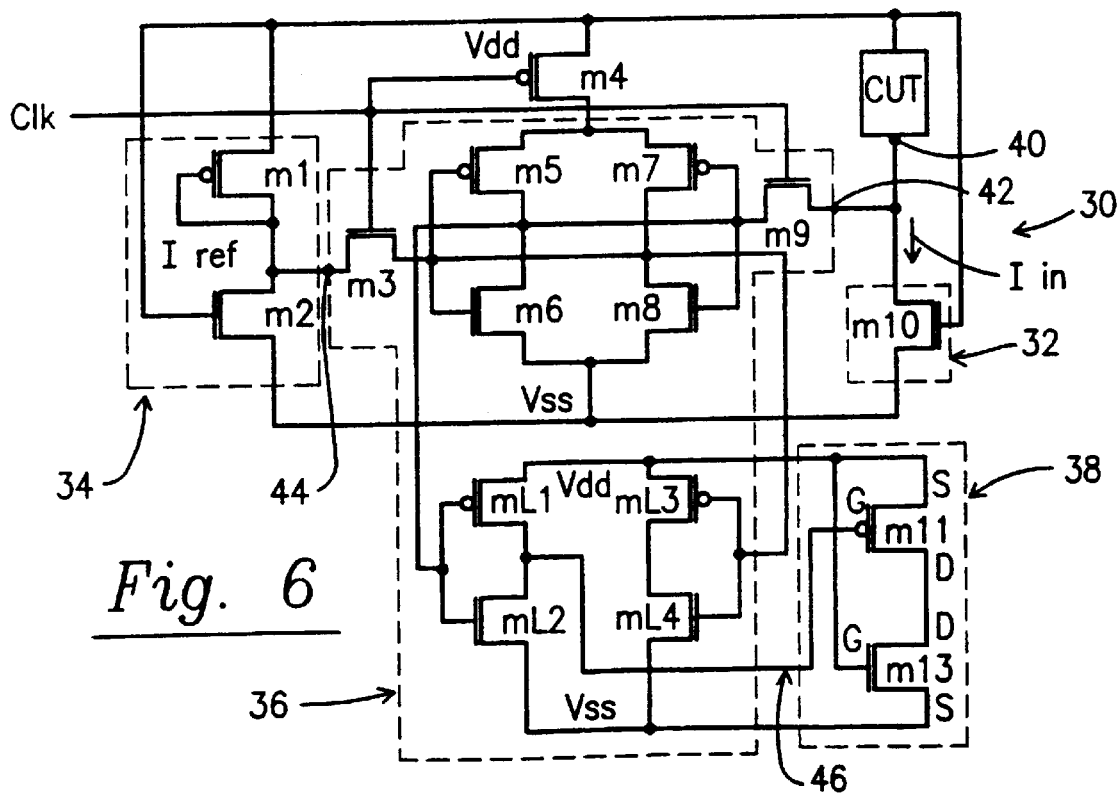
FIG. 6 is a schematic view of an alternative embodiment of the built in current sensor circuit of the present invention illustrating the electrical configuration and component make up of the detecting means, comparator means, reference source means and active output load that utilizes a pair of complementary output transistors.

In now referring to FIG. 6, an alternative embodiment of the built in current sensor circuit 30 can be seen wherein the active output load 38 is formed generally from a pair of complementary output transistors m11 and m13. The pair of complementary output transistors m11 and m13 facilitate assigning a wider range of unique current draw amounts to the active output load 38. Although various forms of transistors may be utilized to form the pair of complementary output transistors m11 and m13, it is preferable that the output transistor m11 be in the nature of a p-MOSFET and that the output transistor m13 be in the nature of an n-MOSFET. Similarly, as described above in the active output load 38 used in the first, the output transistors m11 and m13 are sized to draw unique amounts of current for the purpose of identifying which particular partition is defective in an integrated circuit having multiple partitions being tested.

The pair of complementary output transistors m11 and m13 are configured in series such that their respective drains D are electrically coupled together with the source of output transistor m13 electrically coupled to the ground line Vss and the source S of output transistor m11 electrically coupled to the bias line Vdd. The gate G of output transistor m11 is electrically coupled to the output 46 of the comparator means 36. Thus, when the active output load 38 is turned on by the comparator means 36 when a defect is detected in the circuit under test CUT, the output transistor m11 turns on allowing current to flow through both output transistors m11 and m13.

Figure 7:
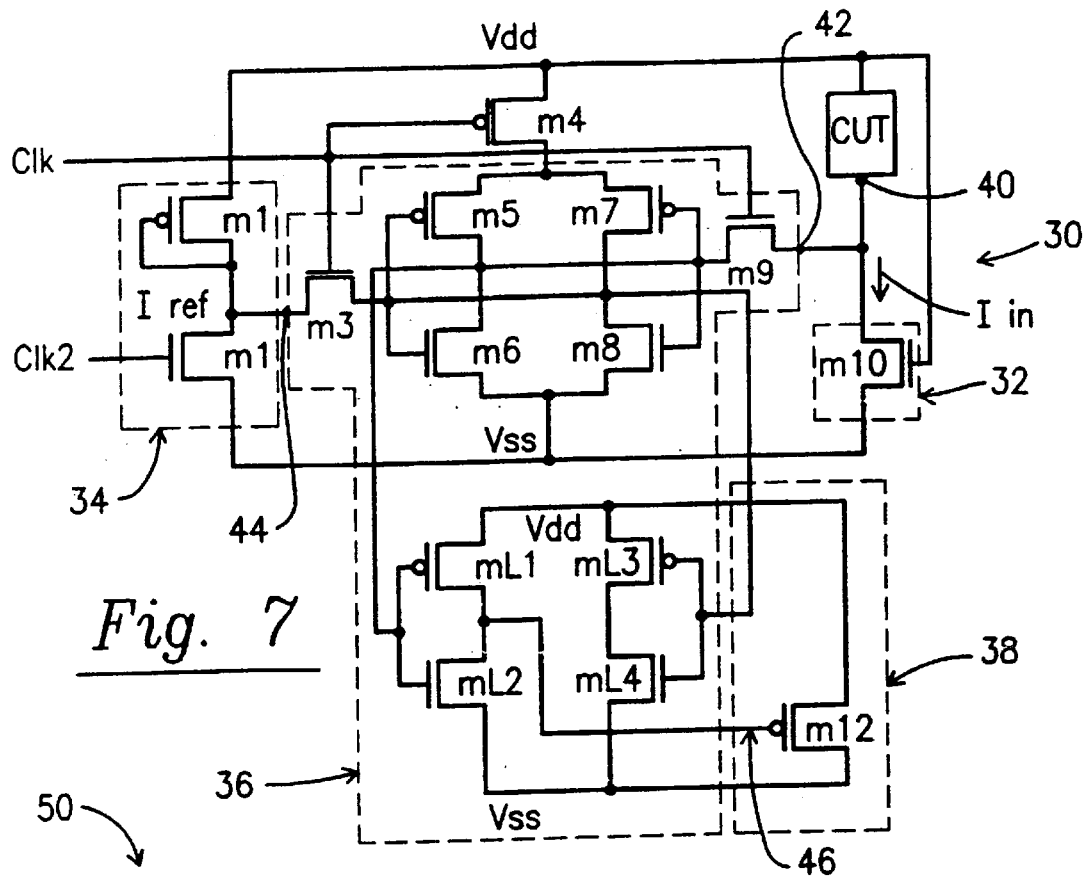
FIG. 7 is a schematic view of a second alternative embodiment of the built in current sensor circuit of the present invention illustrating the electrical configuration and component make up of the detecting means, comparator means, reference source means and active output load that utilizes a first and a second clock signal to intermittently perform the comparison testing of the representative signal to the reference threshold signal.

In now referring to FIG. 7, a second alternative embodiment of the built in current sensor circuit 30 can be seen wherein a second clock signal CLK2 is utilized to turn on the voltage level setting transistor m2 of the reference source means 34. Since the voltage reference setting transistor m2 is normally turned on and continually conducting current, this second alternative embodiment allows for the conservation of the total power consumption in applications where partitioned Very Large Scale Integrated Circuits (VLSI) are employing many built in current sensor circuits 30. The second clock signal CLK2 is preferably synchronized with the first clock signal CLK such that the pulse edge of the first clock signal CLK is delayed by a few nanoseconds with respect to the pulse edge of the second clock signal CLK2. This will allow for the voltage level setting transistor m2 to stabilize after being enabled before the comparator means 36 is biased up and the testing for defects in the circuit under test CUT is performed.

Figure 8:
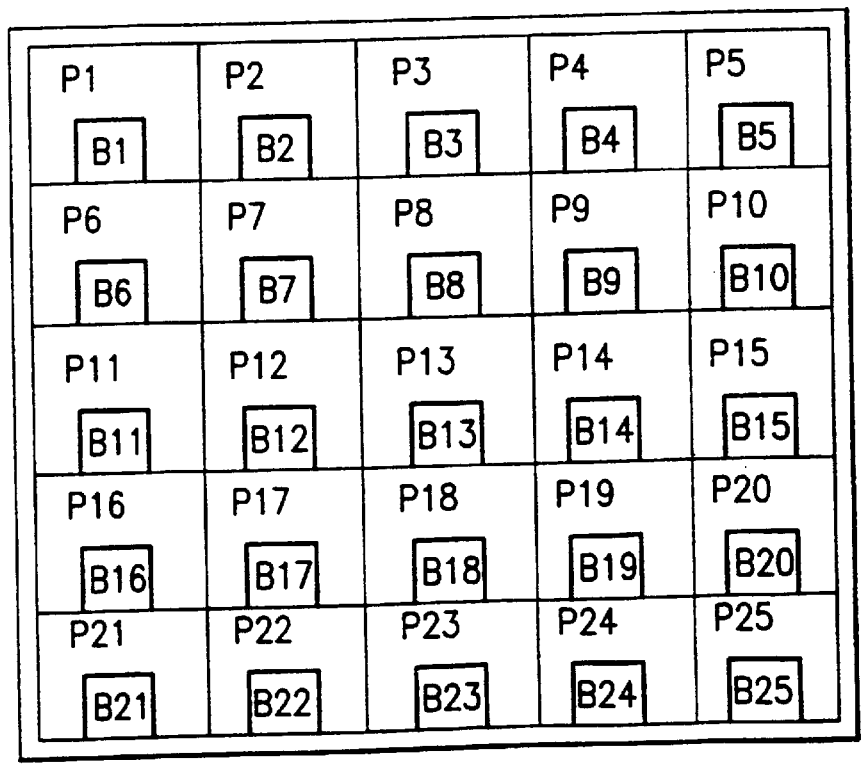
FIG. 8 is a top plan view of the layout of a partitioned integrated circuit utilizing the built in current sensor circuit of the present invention shown in FIG. 5 illustrating the various partitions and built in current sensor circuit locations along with the absence of the excessive area overhead taken up by additional transmissions lines and summing circuits as required in known built in current sensor circuits.

In referring now to FIG. 8, a top plan view of the typical layout of a partitioned integrated circuit 50 resulting from the utilization of the built in current sensor circuit 30 of the present invention illustrating the various partitions P1–P25 and locations of built in current sensor circuits B1–B25 can be seen. In addition, it can be further seen that the excessive area overhead taken up by the additional transmissions lines and summing circuits required in known built in sensor circuits has been eliminated. By utilizing the built in current sensor circuit 30 of the present invention, more partitions of integrated circuits are possible within the same amount of area as previously used in the known built in current sensors 15 as illustrated in FIG. 3.

Now that the general structure of the built in current sensor circuit 30 has been described in detail, the operation of the built in current sensor circuit 30 can be readily understood. When performing IDDQ testing on a circuit under test CUT, the total current flowing through the circuit under test CUT is detected and sensed by the detecting means 32. The circuit under test CUT has certain automatic test signal patterns applied to its input terminals which are designed to manifest any defects in the circuit under test CUT if they are present. The defects are manifested in the form of an increase in the steady state current draw of the circuit under test CUT. The detecting means 32 senses the current flowing (the IDDQ current) through the circuit under test CUT and produces a representative signal corresponding to the current flow. It is the detecting transistor m10, biased in its linear region, that translates the IDDQ current into a proportional voltage. The proportional voltage forms the representative signal and is seen across the detecting transistor m10.

The translating characteristic function of the detecting transistor m10, biased in its linear region, is represented by $$I_{ds}=\beta[(V_{gs}-V_t)V_{ds}-(V_{ds}^2/2)]$$

where $I_{ds}$ denotes the drain current, $V_{gs}$ and $V_{ds}$ represent the gate-source and drain-source voltage, respectively, $V_t$ is the threshold voltage, and $\beta$ is the transconductance. When $V_{ds}$ is small compared with $V_{gs}-V_t$, the above equation is reduced to $$V_{ds}=I_{ds}/[\beta(V_{gs}-V_t)]$$

Thus, the $V_{ds}$ developed across m10 is directly proportional to the $I_{ds}$ current which is the IDDQ of the CUT (represented in FIGS. 5, 6 and 7 as Iin). The two identical nMOSFETs, m10 and m2, are used to sample the current flowing through the circuit under test CUT and the reference current Iref generated by the current generating transistor m1, respectively.

The reference current, Iref, can be generated on chip locally, routed from a common voltage reference bus, or generated off chip using an external supply. However, it is preferable that the reference current Iref be generated on chip by p-channel MOSFET, m1. The level of the reference current Iref is set according to the gate width-to-length ratio of m1 which is predetermined and designed into the built in current sensor circuit 30. The specific amount of reference current Iref to be designed for is determined by calculating what current level will be the representative point at which it is assumed that a defect is present in the circuit under test CUT. The reference current Iref then results in a corresponding voltage being produced across the voltage level setting transistor m2 which is subsequently provided to the second input 44 of the comparator means 36.

The s-ram cell of the comparator means 36, comprised of MOSFET transistors m3 and m5 through m9, performs the comparison of the representative signal electrically coupled to the first input 42 to the reference threshold signal electrically coupled to the second input 44 when the gate G of the enabling transistor m4 is provided a logic low from the clock signal CLK. It is noted that enabling transistors m3 and m9 are first turned on with a logic high from the clock signal CLK then turned off as enabling transistor m4 is turned on with a logic low clock signal CLK. This is so to allow the representative signal and reference threshold signal time to first be seen at the gates of transistors m7 and m8 and m5 and m6 respectively before the s-ram cell is biased up and performs the comparison. When the s-ram cell is performing the comparison, enabling transistors m3 and m9 are turned off.

When the representative signal is greater than the reference threshold signal, the transistor mL1 in the buffer cell of the comparator means 36 is turned on and causes the voltage on the bias line Vdd to be seen at the drain D of transistor mL1. This bias line Vdd voltage is then electrically coupled to the active output load 38 thereby turning on the output transistor m12. When turned on, the active output load 38 will draw a unique amount of current that will identify the particular partition where the defect is located.

Therefore, in FIG. 8, each of the built in current sensor circuits B1–B25 located in each of the partitions P1–P25 will have a respective active output load 38 that has a unique amount of current draw associated with it. The unique amount of additional current drawn by the active output load 38 will be readily observable on the bias line Vdd by way of a standard off-the-shelf current monitor.

In the first alternative embodiment shown in FIG. 6, the electrical operation is similar to that described above excepting to the active output load 38 being comprised of a pair of complementary transistors m11 and m13 wherein the additional current draw associated with the active output load 38 is being caused by two separate transistors. In this first alternative embodiment, it is transistor m11 that is turned on by the output form the buffer cell of the comparator means 36. Transistor m13 is configured to be constantly turned on by having its gate G electrically coupled to the bias line Vdd.

In the second alternative embodiment shown in FIG. 7, the electrical operation is again similar to that described above excepting to the voltage level setting transistor m2 of the reference source means 34 being turned off during times of non-testing so to conserve power consumption that may become critical in VLSI circuits having many partitions.

This power conservation goal could also be achieved by way of electrically coupling the already present clock signal CLK also to the gate G of the voltage level setting transistor m2 without the need of a second clock signal CLK2. For this approach to be feasible, the pulse of the clock signal CLK would need to be increased to allow for current stabilization.

In designing a 1V/0.1 μm model of a built in current sensor circuit 30, the following element dimensions listed below in Table 1 were determined and shown to operate successfully:

TABLE 1

| Element | Nominal Width (μm) | Variation (μm) |
| --- | --- | --- |
| m1 | .7 | ~±.2 |
| m2 | .2 | 0 |
| m3 | .2 | 0 |
| m4 | .2 | 0 |
| m5 | .2 | 0 |
| m6 | .2 | 0 |
| m7 | .2 | 0 |
| m8 | .2 | 0 |
| m9 | .2 | 0 |
| m10 | 100 | +200 |
| m12 | 1 | +10 |

TABLE 1-continued

| Element | Nominal Width (μm) | Variation (μm) |
|---|---|---|
| mL1 | .2 | 0 |
| mL2 | .2 | 0 |
| mL3 | .2 | 0 |
| mL4 | .2 | 0 |

The present disclosure includes that contained in the appended claims, as well as that of the foregoing description. Although this invention has been described in its preferred form with a certain degree of particularity, it should be understood that the present disclosure of the preferred form has been made only by way of example and that numerous changes in the details of construction and the combination and arrangement of parts may be resorted to without departing from the spirit and scope of the invention.

Now that the invention has been described.

What is claimed is:

1. A built in current sensor circuit for use in testing integrated circuits for defects by sensing current increases caused by the defects, said built in current sensor circuit comprising in combination:

detecting means for detecting circuit flow through the integrated circuit and providing a representative signal therefor, said detecting means comprising a detecting transistor that produces the representative signal;

reference source means for providing a reference threshold signal, said reference source means being electrically coupled relative to said detecting means;

comparator means for comparing the reference threshold signal to the representative signal, said comparator means being electrically coupled to said detecting means and electrically coupled to said reference source means;

said reference source means comprising a current generating transistor electrically coupled to a voltage level setting transistor, whereby the voltage level setting transistor is electrically coupled to said comparator means, said detecting transistor having process parameters that match the process parameters of said voltage level setting transistor;

and an active output load electrically coupled to said comparator means, said active output load being sized to draw a disproportionately larger current when turned on than the current caused by the defect in the integrated circuit, whereby said comparator means turns on said active output load when said representative signal is determined to be larger than said reference threshold signal and the current draw of the active output load is resultantly sensed indicating that the integrated circuit is defective.

2. The built in current sensor circuit as recited in claim 1, wherein said active output load is comprised of a transistor.

3. The built in current sensor circuit as recited in claim 1, wherein said active output load is comprised of a pair of complementary transistors.

4. A method for testing integrated its for defects utilizing quiescent power supply current testing comprising the steps of:

providing an integrated circuit having input terminals and output terminals, the integrated circuit being electrically coupled to a bias line;

providing a built in current sensor circuit electrically coupled to the output terminal of the integrated circuit and electrically coupled to the bias line;

biasing up the integrated circuit and the built in current sensor circuit by applying power to the bias line;

applying predetermined test pattern signals to the input terminals of the integrated circuit;

detecting the total curent flowing through the integrated circuit and producing a representative signal therefor;

providing a predetermined reference threshold signal;

comparing the representative signal to a predetermined reference threshold signal;

turning on an active output load so to enable an output current to be drawn when the representative signal is compared to the reference threshold signal and a defect is determined, wherein the active output load is sized to draw a specific output current that is disproportionately larger than the current due to the defect, and when the unique amount of current drawn by the active output load is identified with the popular integrated circuit being tested by the built in current sensor circuit;

monitoring the bias line to detect any disproportionate increase in current and determining the amount of increase over the current of the integrated circuit and built in current sensor circuit at steady state to identify the particular integrated circuit that is defective; and the step of biasing up said integrated circuit and said built in current sensor circuit by applying power to the bias line comprising the step of applying a timing signal to said built in current sensor circuit so as to intermittently bias up the built in current sensor circuit and periodically perform comparisons of the representative signal to the predetermined reference threshold signal.

* * * * *